United States Patent
Lebon et al.

(10) Patent No.: US 9,891,268 B2
(45) Date of Patent: Feb. 13, 2018

(54) APPARATUS AND METHOD FOR GENERATING SIGNALS FOR ESD STRESS TESTING AN ELECTRONIC DEVICE AND SYSTEM FOR PERFORMING AN ESD STRESS TEST OF AN ELECTRONIC DEVICE

(71) Applicant: Infineon Technologies AG, Neubiberg (DE)

(72) Inventors: Julien Lebon, München (DE); Yiqun Cao, München (DE); Ulrich Glaser, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/800,535

(22) Filed: Jul. 15, 2015

(65) Prior Publication Data

US 2017/0016945 A1    Jan. 19, 2017

(51) Int. Cl.
     *G01R 31/00*      (2006.01)
     *G01R 31/28*      (2006.01)

(52) U.S. Cl.
CPC ....... *G01R 31/2841* (2013.01); *G01R 31/002* (2013.01)

(58) Field of Classification Search
CPC ............. H01L 27/0255; H01L 27/0266; H01L 27/0292; G01R 31/002; G01R 31/2841; G01R 31/31816; G01R 31/318541; G01R 31/318569; G01R 33/50; G01R 33/56; G01R 33/5608; G01R 31/001; G01R 31/2839; G01R 31/2851; G01R 31/308; G01R 33/46; G01R 33/483; G01R 33/485; G06F 11/267; G06F 11/1008; G06F 11/24; G06F 19/12; G01N 21/1702; H04J 3/00
See application file for complete search history.

(56) References Cited

U.S. PATENT DOCUMENTS

| | | | |
|---|---|---|---|
| 2007/0159186 A1* | 7/2007 | Grund | G01R 27/04 324/678 |
| 2007/0159205 A1* | 7/2007 | Grund | G01R 31/002 324/762.02 |
| 2008/0315891 A1* | 12/2008 | Grund | G01R 31/2837 324/534 |
| 2009/0134880 A1* | 5/2009 | Grund | G01R 31/002 324/537 |

OTHER PUBLICATIONS

"ESD Association Standard Test Method for the Protection of Electrostatic Discharge Susceptible Items; Electrostatic Discharge Sensitivity Testing—Transmission Line Pulse (TLP)—Component Level," Electrostatic Discharge Association, ANSI/ESD STM5.5. 1-2008, May 19, 2008, 26 pages.

* cited by examiner

*Primary Examiner* — Vinh Nguyen
(74) *Attorney, Agent, or Firm* — Slater Matsil, LLP

(57) ABSTRACT

An apparatus and a method for generating signals for ESD stress testing an electronic device are disclosed. In an embodiment the apparatus is configured to receive a source signal including a source pulse, delay the source pulse to generate a test signal including a test pulse with a pulse width in an ESD time range and generate an auxiliary signal including an auxiliary pulse with a pulse width in the ESD time range.

20 Claims, 11 Drawing Sheets

APPARATUS AND METHOD FOR GENERATING SIGNALS FOR ESD STRESS TESTING AN ELECTRONIC DEVICE AND SYSTEM FOR PERFORMING AN ESD STRESS TEST OF AN ELECTRONIC DEVICE

TECHNICAL FIELD

The present invention relates generally to an apparatus and a method for generating signals for ESD stress testing an electronic device and to a system for performing an ESD stress test of an electronic device.

BACKGROUND

Electrostatic discharge (ESD) is a threat to electronic devices, in particular to semiconductor devices. It is known to perform ESD stress tests of electronic devices to characterize the behavior of the devices under ESD stress. ESD events typically occur in short time ranges between 1 ns and 1 μs. ESD stress tests must be carried out on the same timescale to provide realistic results.

It is known to use transmission line pulse (TLP) systems to apply defined stress pulses to a device under test. The document "ESD Association Standard Test Method for the Protection of Electrostatic Discharge Susceptible Items", Electrostatic Discharge Association, 2008, ANSI/ESD STM5.5.1-2008 describes a method for pulse testing to evaluate a voltage current response of a component under test. This technique is known as transmission line pulse testing.

Certain electronic devices require that more than one pulse or signal is applied to various terminals of the device to fully characterize the behavior of this device. Testing a transistor may, for example, require to bias a gate of the transistor before applying a test pulse to the device.

SUMMARY

In various embodiments an apparatus for generating signals for ESD stress testing an electronic device comprises means for receiving a source signal comprising a source pulse, delaying the source pulse to generate a test signal comprising a test pulse with a pulse width in the ESD time range, and generating an auxiliary signal comprising an auxiliary pulse with a pulse width in the ESD time range.

In various embodiments a system for performing an ESD stress test of an electronic device comprises a pulse source for generating a source signal comprising a source pulse, means for delaying the source pulse to generate a test signal comprising a test pulse with a pulse width in the ESD time range, and means for generating an auxiliary signal comprising an auxiliary pulse with a pulse width in the ESD time range.

In various embodiments a method for generating signals for ESD stress testing an electronic device is provided, wherein the method includes receiving a source signal comprising a source pulse, delaying the source pulse to generate a test signal comprising a test pulse with a pulse width in the ESD time range, and generating an auxiliary signal comprising an auxiliary pulse with a pulse width in the ESD time range.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION OF ILLUSTRATIVE EMBODIMENTS

Figure 1:
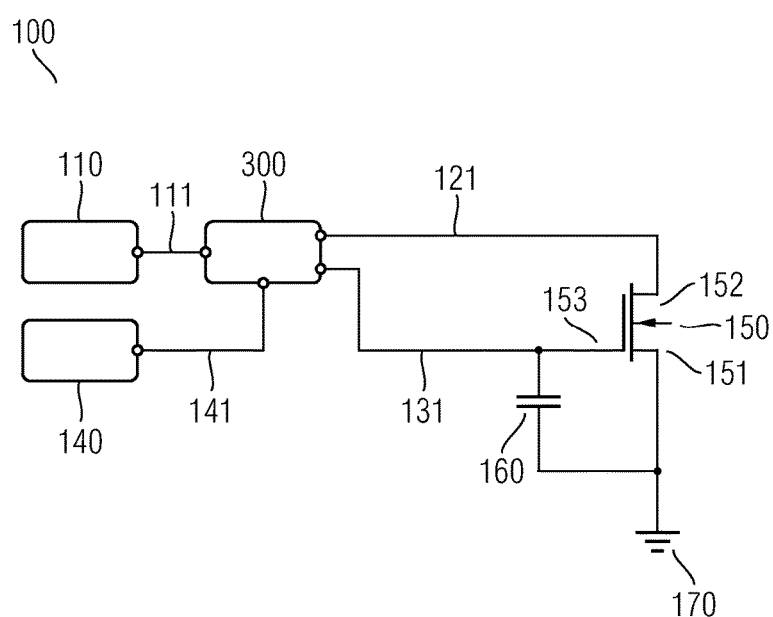
FIG. 1 shows a schematic circuit diagram of a system for performing an ESD stress test according to various embodiments.

FIG. 1 shows a schematic diagram of a system 100 according to various embodiments. The system 100 may be used for performing an ESD stress test of an electronic device 150, which itself is not part of the system 100.

The device 150 may generally be referred to as the device under test (DUT). In FIG. 1, the device 150 is exemplarily illustrated as a field effect transistor comprising a source 151, a drain 152 and a gate 153. The system 100 may, however, serve also for performing ESD stress tests of other kinds of devices.

ESD pulses typically comprise pulse widths in the time range of 1 ns to 1 μs with rise times in the time range of 100 ps to 10 ns. The time range of 1 ns to 1 μs may thus be referred to as the ESD time range.

The system 100 comprises a pulse source 110. The pulse source 110 is configured for generating a source signal 111 comprising one or more source pulses. The pulse source 110 may adjust parameters of the source signal 111, for example, rise times and decay times of the source pulses, pulse widths of the source pulses, a number of source pulses and an amplitude of the source pulses. The pulse source 110 may be controlled by a computer.

The pulse source 110 may be configured to generate the source signal 111 with source pulses with pulse widths between, for example, 1 ns and 1 µs and with rise times between, for example, 100 ps and 10 ns. The pulse source 110 may thus be configured to generate the source signal 111 with source pulses in the ESD time range. The system 100 may be referred to as a very-fast system if the pulse width is between 1 ns and 10 ns. The pulse source 110 may be configured to generate the source signal 111 with source pulses with an amplitude of up to 100 V or above.

The system 100 further comprises a DC voltage unit 140. The DC voltage unit 140 is configured for providing a DC voltage 141. The DC voltage 141 may, for example, comprise a voltage of several volts to tens of volts or more.

The system 100 further comprises an apparatus 300 configured with means for receiving the source signal 111 and the DC voltage 141 and for generating a test signal 121 and an auxiliary signal 131.

Figure 2A:
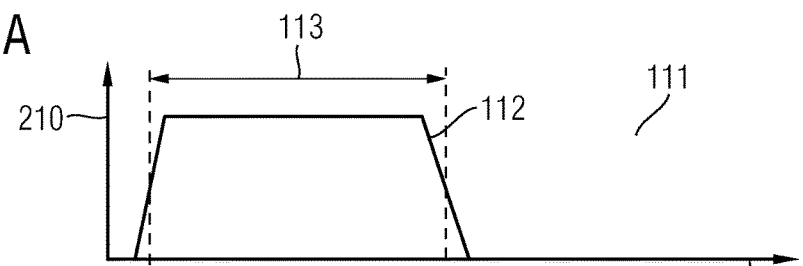
FIGS. 2A to 2C show signals used for ESD stress testing an electronic device according to various embodiments.
Figure 2B:
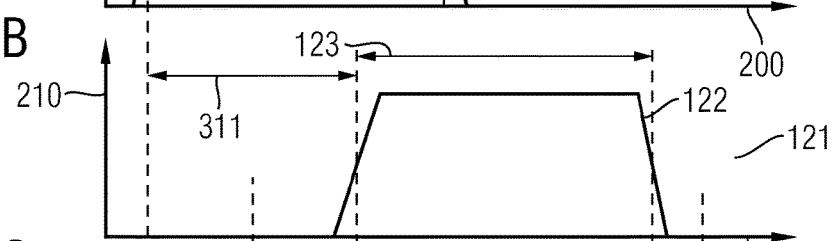
Figure 2C:
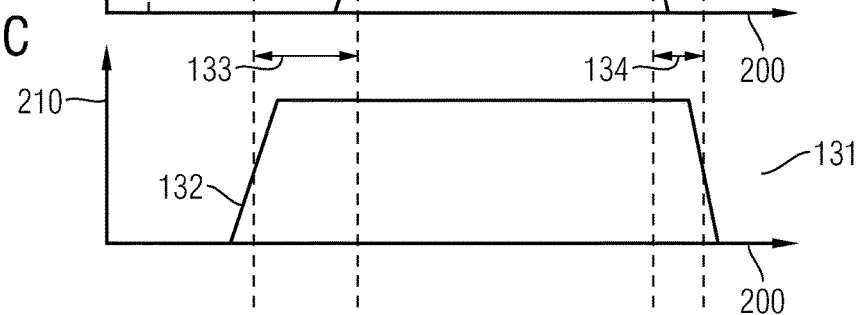

FIG. 2A shows a schematic diagram illustrating the source signal 111. FIG. 2B shows a schematic diagram illustrating the test signal 121. FIG. 2C shows a schematic diagram illustrating the auxiliary signal 131. Each of the diagrams of FIGS. 2A, 2B and 2C show a time 200 on a horizontal axis and an amplitude 210 of the respective signal on a vertical axis.

The source signal 111 comprises a source pulse 112. The source pulse 112 comprises a source pulse width 113. The source pulse width 113 may, for example, be between 1 ns and 1 µs, thus in the ESD time range.

The test signal 121 comprises a test pulse 122. The test pulse 122 comprises a test pulse width 123 which equals the source pulse width 113 or differs from the source pulse width 113 by not more than 10%. The test pulse width 123 may, for example, be between 1 ns and 1 µs. The test pulse 122 comprises a rise time which differs from a rise time of the source pulse 112 by not more than 10%. The test pulse 122 may thus be considered as similar or almost identical to the source pulse 112. The test pulse 122 may comprise an amplitude which is different from an amplitude of the source pulse 112. In particular, the amplitude of the test pulse 122 may be smaller than the amplitude of the source pulse 112.

The test pulse 122 of the test signal 121 is delayed with respect to the source pulse 112 of the source signal 111 by a first delay time 311. The first delay time 311 may, for example, be between 10 ns and 1 µs.

The auxiliary signal 131 comprises an auxiliary pulse 132. The auxiliary pulse 132 comprises an amplitude which is independent of the amplitude of the source pulse 112. The amplitude of the auxiliary pulse 132 may be higher or lower than the amplitude of the source pulse 112.

The auxiliary pulse 132 may rise before a rise of the test pulse 122 and may decay after a decay of the test pulse 122. In one embodiment, the auxiliary pulse 132 rises by a lead time 133 earlier than the test pulse 122 and decays by a follow-up time 134 later than the test pulse 122. The lead time 133 is smaller than or equals the first delay time 311.

In another embodiment, the auxiliary pulse 132 may rise before a rise of the test pulse 122 and may decay before a decay of the test pulse 122.

In still another embodiment, the auxiliary pulse 132 may rise after a rise of the test pulse 122 and may decay after a decay of the test pulse 122.

In still another embodiment, the auxiliary pulse 132 may rise after a rise of the test pulse 122 and may decay before a decay of the test pulse 122.

In some embodiments, the absolute difference in time between the rise of the auxiliary pulse 132 and the rise of the test pulse 122 is smaller than 10 µs. In some embodiments, the absolute difference in time between the decay of the auxiliary pulse 132 and the decay of the test pulse 122 is smaller than 10 µs.

Referring again to FIG. 1, in order to perform an ESD stress test of the device 150, the source 151 of the device 150 may be connected to a defined potential, for example, to ground potential 170. The auxiliary signal 131 generated by the apparatus 300 may be applied to the gate 153 of the device 150. The test signal 121 generated by the apparatus 300 may be applied to the drain 152 of the device 150.

A capacitor 160 may be arranged in parallel to the device 150 between the gate 153 and the source 151 of the device 150 to damp oscillations due to a capacitive coupling between the drain 152 and the gate 153 of the device 150. The capacitor 160 may, for example, comprise a capacitance between 100 pF and 10 nF.

The test signal 121 and the auxiliary signal 131 may alternatively be applied to other terminals of the device 150. The auxiliary signal 131 may, for example, be applied to a bulk terminal of the device 150. The apparatus 300 may also be configured to generate further auxiliary signals which may be applied to further terminals of the device 150.

Figure 3:
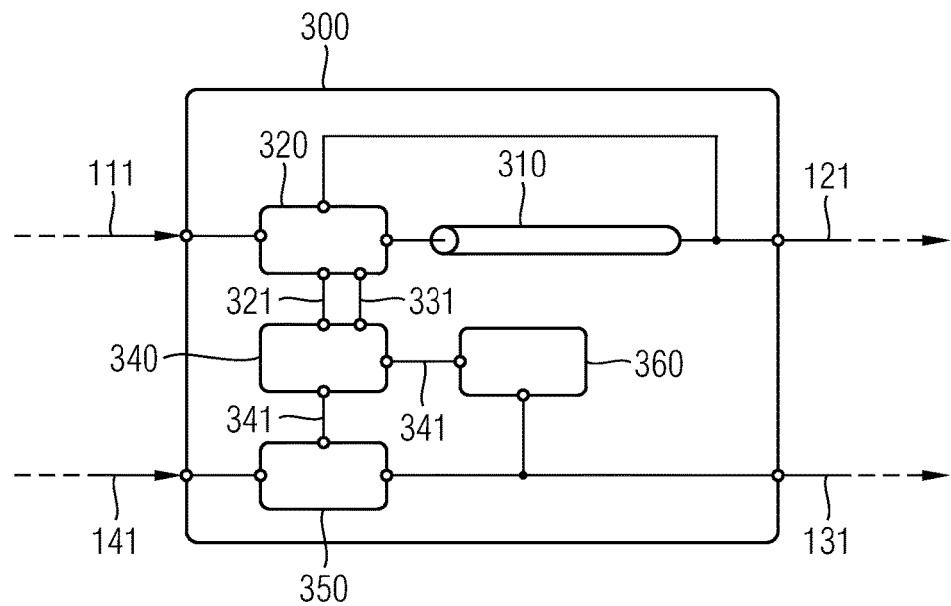
FIG. 3 shows a schematic circuit diagram of an apparatus for generating signals for ESD stress testing an electronic device according to various embodiments.

FIG. 3 shows a schematic circuit diagram illustrating the apparatus 300 of the system 100 according to various embodiments.

The apparatus 300 comprises a first delay line 310 for delaying the source pulse 112 of the source signal 111 by the first delay time 311 to generate the test signal 121 with the test pulse 122. In various embodiments, the first delay line 310 may be configured as a coaxial cable matching the impedance of the pulse source 110.

The apparatus 300 further comprises a signal sense circuit 320 for generating a first sense signal 321 comprising a first sense pulse indicative of a rise and a decay of the source pulse 112 of the source signal 111. In various embodiments, the signal sense circuit 320 may also be configured for generating a second sense signal 331 comprising a second sense pulse indicative of a rise and a decay of the test pulse 122 of the test signal 121.

The apparatus 300 further comprises a signal processing circuit 340 for generating a control signal 341 comprising a control pulse which rises before a rise of the test pulse 122 of the test signal 121 and which decays after a decay of the test pulse 122 of the test signal 121.

The apparatus 300 further comprises a regulation circuit 350 for generating the auxiliary signal 131 such that the auxiliary pulse 132 rises and decays in response to a rise and a decay of the control pulse of the control signal 341.

In various embodiments the apparatus 300 furthermore comprises a shutdown circuit 360 for pulling the auxiliary signal 131 to ground after a decay of the control pulse of the control signal 341. The shutdown circuit 360 may, however, be omitted.

Figure 4:
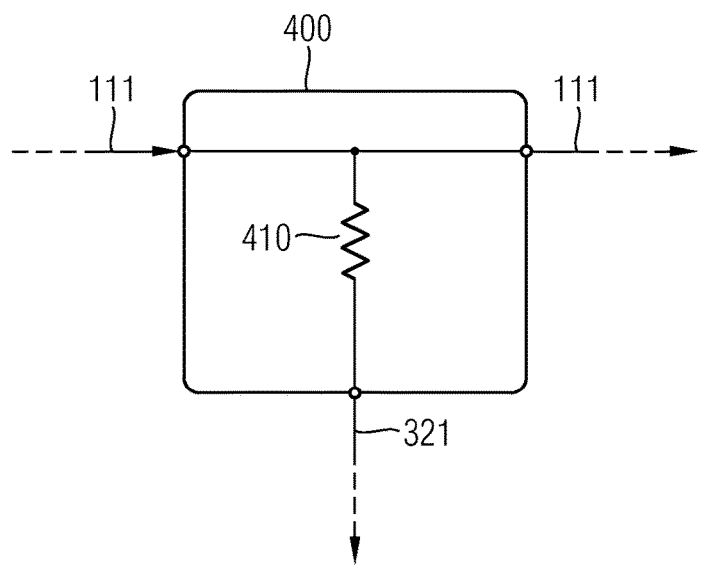
FIG. 4 shows a schematic circuit diagram of a signal sense circuit according to various embodiments.

FIG. 4 shows a schematic circuit diagram of a signal sense circuit 400. In various embodiments the signal sense circuit 320 of the apparatus 300 illustrated in FIG. 3 may be developed like the signal sense circuit 400 illustrated in FIG. 4.

The signal sense circuit 400 comprises a first resistor 410 for sensing the source signal 111 to generate the first sense signal 321. The first resistor 410 may exemplarily comprise a resistance of 1 kΩ or 5 kΩ. A first terminal of the first resistor 410 is connected to the source signal 111. The first sense signal 321 is picked up at a second terminal of the first resistor 410.

Figure 5:
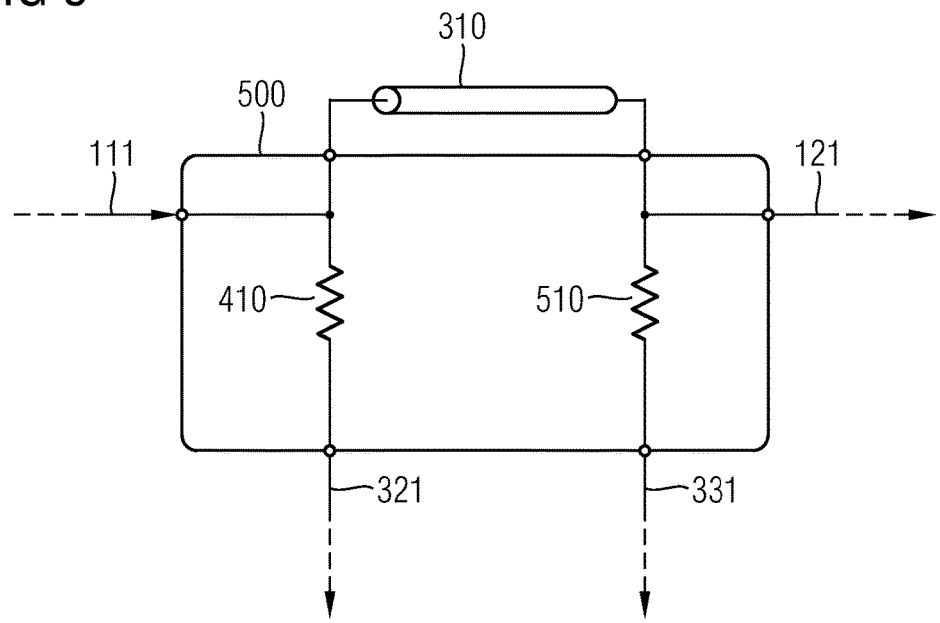
FIG. 5 shows a schematic circuit diagram of a further signal sense circuit according to various embodiments.

FIG. 5 shows a schematic circuit diagram of a further signal sense circuit 500. In various embodiments the signal sense circuit 320 of the apparatus 300 illustrated in FIG. 3 may be developed like the signal sense circuit 500.

The signal sense circuit 500 is similar to the signal sense circuit 400 of FIG. 4 but additionally comprises a second resistor 510 for sensing the test signal 121 to generate the second sense signal 331. The second resistor 510 may exemplarily comprise a resistance of 1 kΩ or 5 kΩ. A first terminal of the second resistor 510 is connected to the test signal 121 after the delay line 310. The second sense signal 331 is picked up at a second terminal of the second resistor 510.

Figure 6:
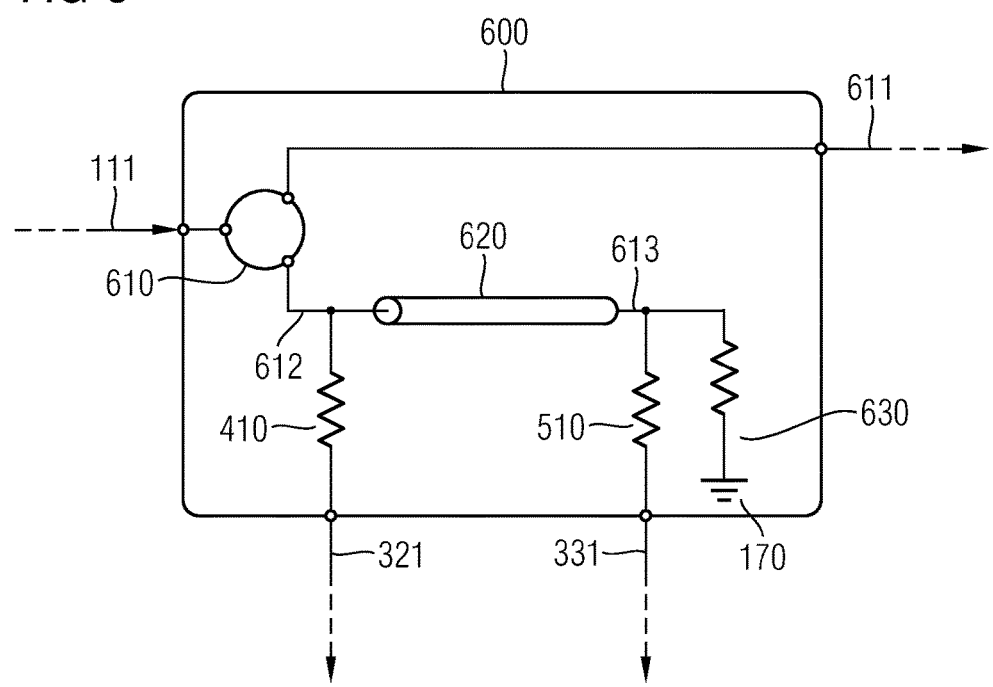
FIG. 6 shows a schematic circuit diagram of a further signal sense circuit according to various embodiments.

FIG. 6 shows a schematic circuit diagram of a further signal sense circuit 600. In various embodiments the signal sense circuit 320 of the apparatus 300 illustrated in FIG. 3 may be developed like the signal sense circuit 600.

The signal sense circuit 600 comprises a first power splitter 610 for splitting the source signal 111 into a first fractional signal 611 and a second fractional signal 612. The first fractional signal 611 is used to generate the test signal 121 by delaying the first fractional signal 611 using the first delay line 310. The second fractional signal 612 is used for generating the first sense signal 321 and the second sense signal 331.

The signal sense circuit 600 comprises a second delay line 620 for delaying the second fractional signal 612 to generate a delayed second fractional signal 613. The second delay line 620 delays the second fractional signal 612 by a delay time which is comparable or equal to the first delay time 311 of the first delay line 310 of the apparatus 300. The second delay line 620 may, for example, comprise a coaxial cable.

The signal sense circuit 600 further comprises a termination 630 to prevent a reflection of the second fractional signal 612 and the delayed second fractional signal 613. The termination may, for example, comprise a 50Ω resistor connected to ground potential 170.

The signal sense circuit 600 comprises a first resistor 410 for sensing the second fractional signal 612 to generate the first sense signal 321. The signal sense circuit 600 furthermore comprises a second resistor 510 for sensing the delayed second fractional signal 613 to generate the second sense signal 331. The first resistor 410 and the second resistor 510 may exemplarily comprise resistances of 1 kΩ or 5 kΩ. A first terminal of the first resistor 410 is connected to the second fractional signal 612. The first sense signal 321 is picked up at a second terminal of the first resistor 410. A first terminal of the second resistor 510 is connected to the delayed second fractional signal 613. The second sense signal 331 is picked up at a second terminal of the second resistor 510.

Figure 7:
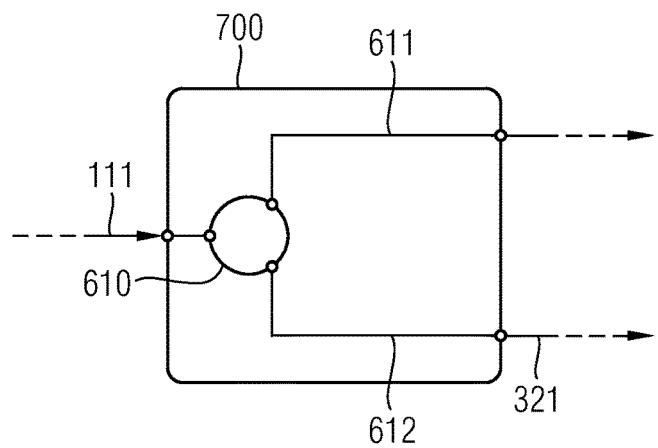
FIG. 7 shows a schematic circuit diagram of a further signal sense circuit according to various embodiments.

FIG. 7 shows a schematic circuit diagram of a further signal sense circuit 700. In various embodiments the signal sense circuit 320 of the apparatus 300 illustrated in FIG. 3 may be developed like the signal sense circuit 700.

The signal sense circuit 700 is similar to the signal sense circuit 600 of FIG. 6 but generates only the first sense signal 321, not the second sense signal 331. The signal sense circuit 700 comprises the first power splitter 610 for splitting the source signal 111 into the first fractional signal 611 and the second fractional signal 612. The first fractional signal 611 is used for generating the test signal 121 by delaying the first fractional signal 611 using the first delay line 310. The second fractional signal 612 is used as the first sense signal 321. The first resistor 410, the second resistor 510, the second delay line 620 and the termination 630 are omitted.

Figure 8:
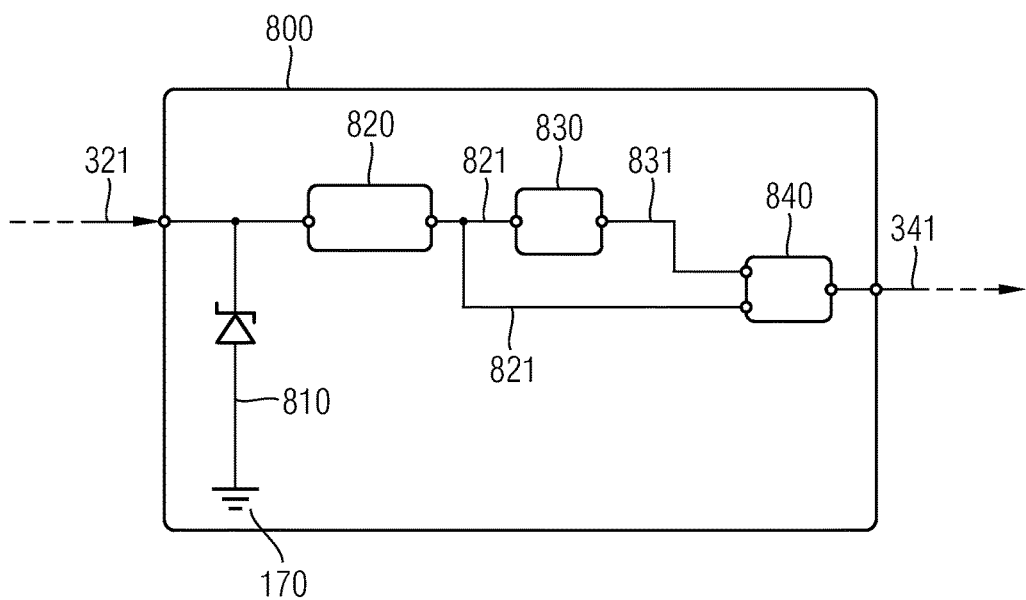
FIG. 8 shows a schematic circuit diagram of a signal processing circuit according to various embodiments.

FIG. 8 shows a schematic circuit diagram of a signal processing circuit 800. In various embodiments the signal processing circuit 340 of the apparatus 300 illustrated in FIG. 3 may be developed like the signal processing circuit 800.

The signal processing circuit 800 comprises a first amplification circuit 820 for amplifying the first sense signal 321 to generate an amplified first sense signal 821. The amplified first sense signal 821 comprises an amplified first sense pulse which is indicative of a rise and a decay of the source pulse 112 of the source signal 111. The amplified first sense signal 821 comprises an amplitude that is different from an amplitude of the first sense signal 321, for example, larger.

In various embodiments the first amplification circuit 820 may comprise an amplifier or a Schmitt trigger.

The signal processing circuit 800 comprises a delay circuit 830 for delaying the amplified first sense signal 821 by a third delay time to generate an amplified second sense signal 831. The amplified second sense signal 831 comprises an amplified second sense pulse which is delayed relative to the amplified first sense pulse by the third delay time. The third delay time is smaller than the source pulse width 113 of the source pulse 112 of the source signal 111.

The delay circuit 830 may be configured as a delay line, for example, as a coaxial cable. The delay circuit 830 may alternatively be configured to allow an adjustment of the third delay time of the delay circuit 830.

The signal processing circuit 800 furthermore comprises an OR gate 840 for generating the control signal 341 such that the control signal 341 assumes a logical high level when at least one of the amplified first sense signal 821 and the amplified second sense signal 831 assumes a logical high level. The OR gate 840 generates the control signal 341 such that the control pulse of the control signal 341 rises with a rise of the amplified first sense pulse and decays with a decay of the amplified second sense pulse. The control pulse thus comprises a pulse width which is larger than the source pulse width 113 of the source pulse 112 of the source signal 111.

Since the amplified first sense signal 821 and the amplified second sense signal 831 comprise an amplitude which is different from an amplitude of the first sense signal 321, the control signal 341 is created with an amplitude that is also different from an amplitude of the first sense signal 321, for example, larger.

The signal processing circuit 800 may comprise a first overvoltage protection 810 for protecting the signal processing circuit 800 from overvoltage. The first overvoltage protection 810 may, for example, comprise a Zener diode arranged between the first sense signal 321 and ground potential 170. In various embodiments, the first overvoltage protection 810 may be omitted.

The first amplification circuit 820, the delay circuit 830 and the OR gate 840 of the signal processing circuit 800 may each be connected to an external voltage source for supplying an operating voltage to the first amplification circuit 820, the delay circuit 830 and the OR gate 840.

Figure 9:
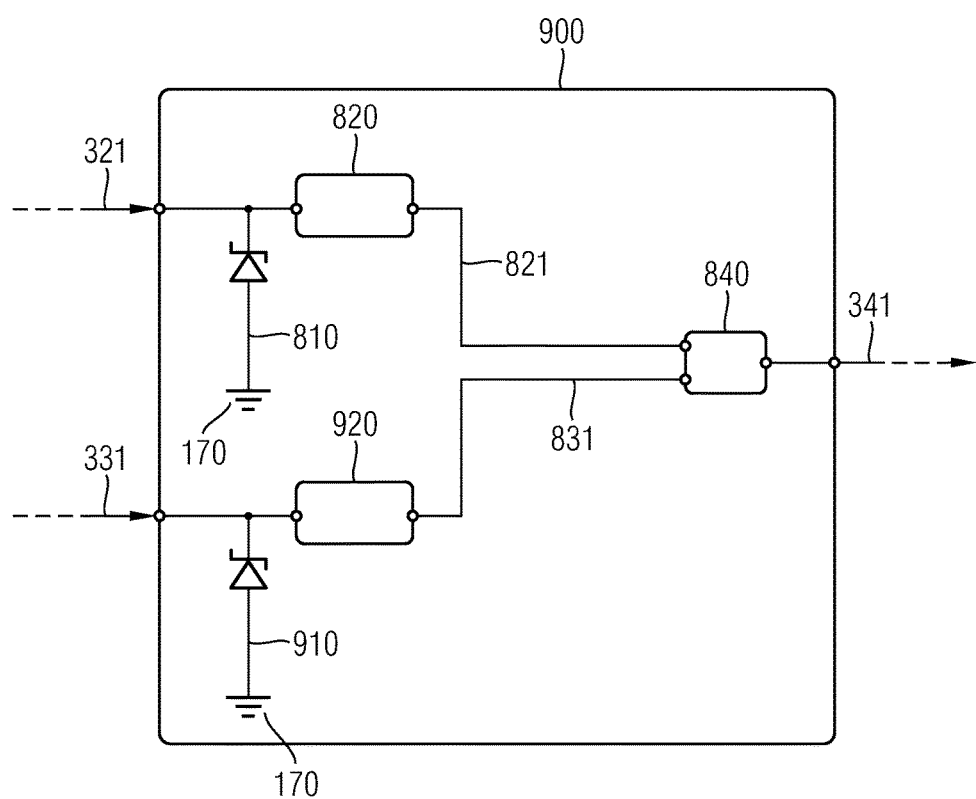
FIG. 9 shows a schematic circuit diagram of a further signal processing circuit according to various embodiments.

FIG. 9 shows a schematic circuit diagram of a further signal processing circuit 900. In various embodiments the signal processing circuit 340 of the apparatus 300 illustrated in FIG. 3 may be developed like the signal processing circuit 900.

The signal processing circuit 900 is similar to the signal processing circuit 800 illustrated in FIG. 8 but differs from the signal processing circuit 800 in that the amplified second sense signal 831 is derived from the second sense signal 331, not from the amplified first sense signal 821.

The amplified first sense signal 821 is generated with the first amplification circuit 820 by amplifying the first sense signal 321. The signal processing circuit 900 furthermore comprises a second amplification circuit 920 for amplifying the second sense signal 331 for generating the amplified second sense signal 831. In various embodiments the second amplification circuit 920 may comprise an amplifier or a Schmitt trigger.

In contrast to the signal processing circuit 800 illustrated in FIG. 8, the signal processing circuit 900 does not comprise a delay circuit.

The control signal 341 is generated by the OR gate 840 of the signal processing circuit 900 such that the control signal 341 assumes a logical high level when at least one of the amplified first sense signal 821 and the amplified second sense signal 831 assumes a logical high level.

In addition to the first overvoltage protection 810 protecting the signal processing circuit 900 from an overvoltage of the first sense signal 321, the signal processing circuit 900 comprises a second overvoltage protection 910 protecting the signal processing circuit 900 from an overvoltage of the second sense signal 331. The second overvoltage protection 910 may, for example, comprise a Zener diode connecting the second sense signal 331 to ground potential 170.

Figure 10:
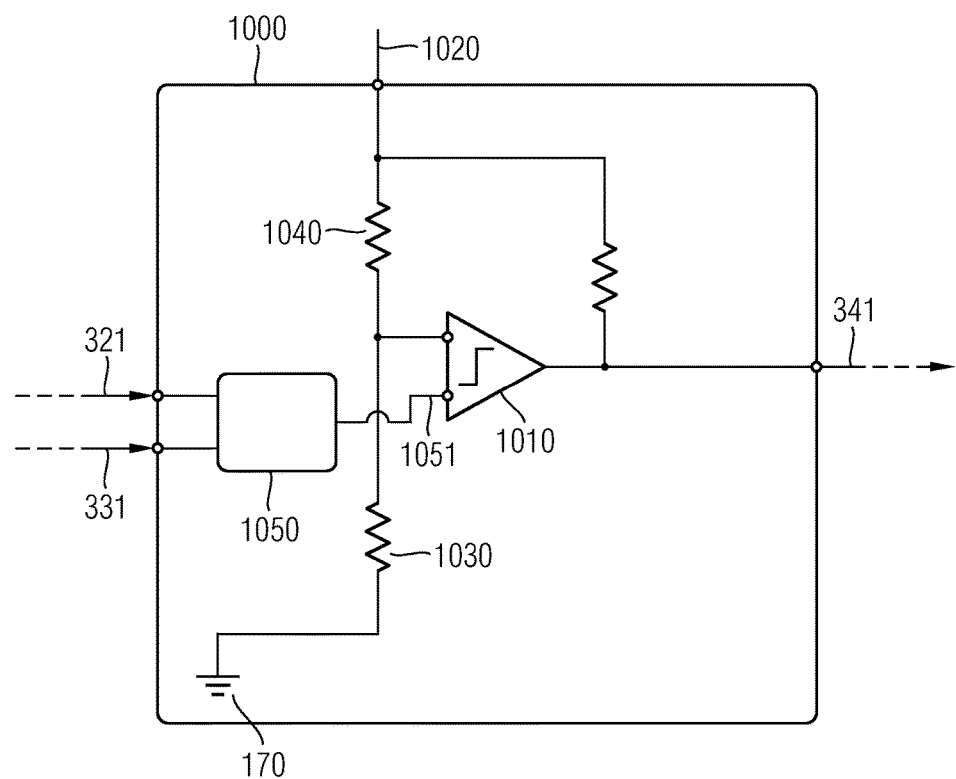
FIG. 10 shows a schematic circuit diagram of a further signal processing circuit according to various embodiments.

FIG. 10 shows a schematic circuit diagram of a further signal processing circuit 1000. In various embodiments the signal processing circuit 340 of the apparatus 300 illustrated in FIG. 3 may be developed like the signal processing circuit 1000.

The signal processing circuit 1000 comprises an electronic mixer 1050 for generating a combined signal 1051. In some embodiments, the combined signal 1051 assumes a logical high level when at least one of the first sense signal 321 and the second sense signal 331 assumes a logical high level. In other embodiments, the combined signal 1051 is larger than a reference voltage when at least one of the first sense signal 321 and the second sense signal 331 is larger than a reference voltage.

The signal processing circuit 1000 comprises a comparator 1010 for generating the control signal 341 by comparing the combined signal 1051 to a reference voltage.

The signal processing circuit 1000 comprises a voltage divider formed from a first resistor 1030 and a second resistor 1040. The voltage divider creates the reference voltage from an external voltage 1020. The reference voltage may be adjusted by adjusting either the first resistor 1030, the second resistor 1040 or the external voltage 1020.

The comparator 1010 compares the reference voltage created by the voltage divider with the combined signal 1051 created by the electronic mixer 1050. Consequently, the signal processing circuit 1000 generates the control signal 341 such that the control signal 341 assumes a high level when at least one of the first sense signal 321 and the second sense signal 331 exceeds the reference voltage. The reference voltage is adjusted such that the control pulse of the control signal 341 is generated such that the control pulse rises with a rise of the first sense pulse of the first sense signal 321 and decays with a decay of the second sense pulse of the second sense signal 331.

Figure 11:
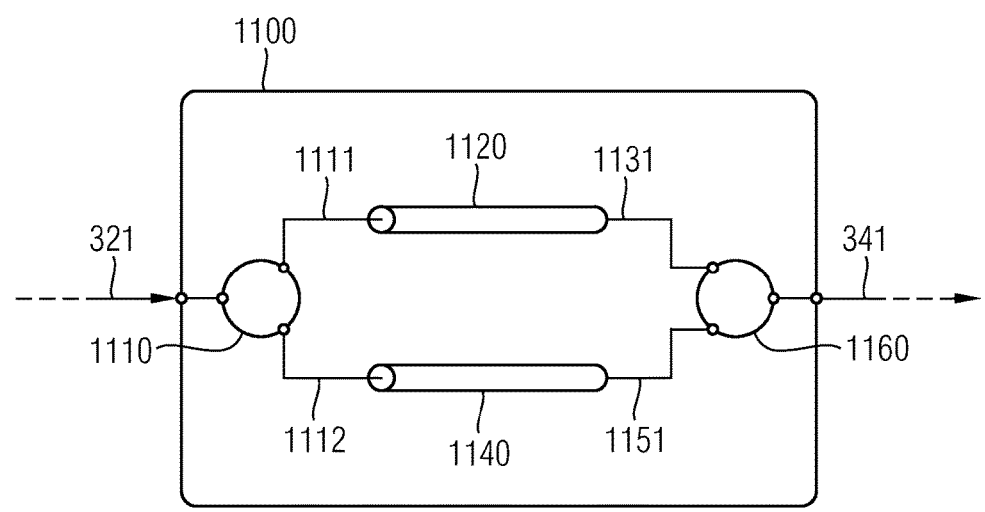
FIG. 11 shows a schematic circuit diagram of a further signal processing circuit according to various embodiments.

FIG. 11 shows a schematic circuit diagram of a further signal processing circuit 1100. In various embodiments the signal processing circuit 340 of the apparatus 300 illustrated in FIG. 3 may be developed like the signal processing circuit 1100.

The signal processing circuit 1100 comprises a second power splitter 1110 for splitting the first sense signal 321 into a first fractional sense signal 1111 and a second fractional sense signal 1112.

The signal processing circuit 1100 comprises a fourth delay line 1120 for delaying the first fractional sense signal 1111 by a fourth delay time 1121 to generate a delayed first fractional sense signal 1131. The signal processing circuit 1100 furthermore comprises a fifth delay line 1140 for delaying the second fractional sense signal 1112 by a fifth delay time 1141 to generate a delayed second fractional sense signal 1151. The fourth delay line 1120 and the fifth delay line 1140 may, for example, comprise coaxial cables.

The signal processing circuit 1100 furthermore comprises a third power splitter 1160 to combine the delayed first fractional sense signal 1131 and the delayed second fractional sense signal 1151 to form the control signal 341.

Figure 12:
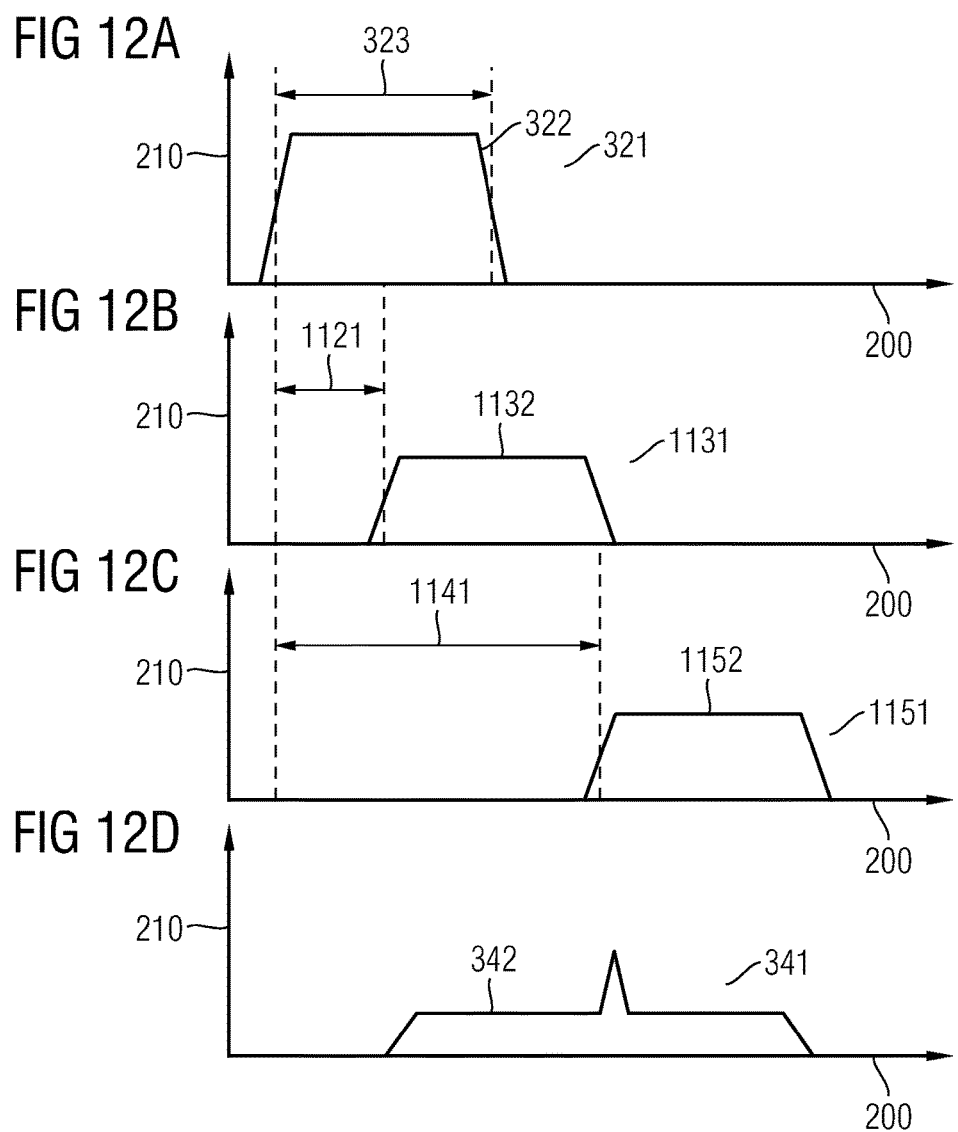
FIGS. 12A to 12D show various signals used in a signal processing circuit according to various embodiments.

FIG. 12A schematically illustrates the first sense signal 321. FIG. 12B schematically illustrates the delayed first fractional sense signal 1131. FIG. 12C schematically illustrates the delayed second fractional sense signal 1151. FIG. 12D schematically illustrates the control signal 341 generated by the signal processing circuit 1100. In each of the diagrams of FIGS. 12A to 12D the time 200 is shown on a horizontal axis while an amplitude is shown on a vertical axis.

The first sense pulse of the first sense signal 321 generated by the signal sense circuit 320 of the apparatus 300 is labelled with numeral 322 in FIG. 12A. The first sense pulse 322 is indicative of a rise and a decay of the source pulse 112 of the source signal 111. The first sense pulse 322 comprises a sense pulse width 323 which is similar or equal to the source pulse width 113 of the source pulse 112 of the source signal 111.

The delayed first fractional sense signal 1131 shown in FIG. 12B comprises a delayed first fractional sense pulse 1132 which is delayed relative to the first sense pulse 322 by the fourth delay time 1121. Since the delayed first fractional sense signal 1131 is generated from the first fractional sense signal 1111 and the first fractional sense signal 1111 is generated from the first sense signal 321 by dividing the first sense signal 321, the delayed first fractional sense pulse 1132 comprises an amplitude which is lower than an amplitude of the first sense pulse 322.

The delayed second fractional sense signal 1151 shown in FIG. 12C comprises a delayed second fractional sense pulse 1152 which is delayed relative to the first sense pulse 322 by the fifth delay time 1141. Since the delayed second fractional sense signal 1151 is generated from the second fractional sense signal 1112 which in turn is generated from the first sense signal 321 by dividing the first sense signal 321, the delayed second fractional sense pulse 1152 comprises an amplitude which is lower than the amplitude of the first sense pulse 322.

In various embodiments the second power splitter 1110 and the third power splitter 1160 of the signal processing circuit 1100 are configured as balanced power splitters. In these embodiments, the amplitude of the delayed first fractional sense pulse 1132 is approximately equal to the amplitude of the delayed second fractional sense pulse 1152.

The fifth delay time 1141 of the fifth delay line 1140 is larger than the fourth delay time 1121 of the fourth delay line 1120. The difference between the fifth delay time 1141 and the fourth delay time 1121 is smaller than or equal to the sense pulse width 323 of the first sense pulse 322 of the first sense signal 321. The fourth delay time 1121 is also smaller than the sense pulse width 323 of the first sense pulse 322 of the first sense signal 321.

The control pulse of the control signal 341 generated by the signal processing circuit 1100 is labelled with numeral 342 in FIG. 12D. The control pulse 341 rises with a rise of the delayed first fractional sense pulse 1132 of the delayed first fractional sense signal 1131 and decays with a decay of the delayed second fractional sense pulse 1152 of the delayed second fractional sense signal 1151. The control pulse 342 comprises a pulse width which is larger than the sense pulse width 323 of the first sense pulse 322 of the first sense signal 321.

Figure 13:
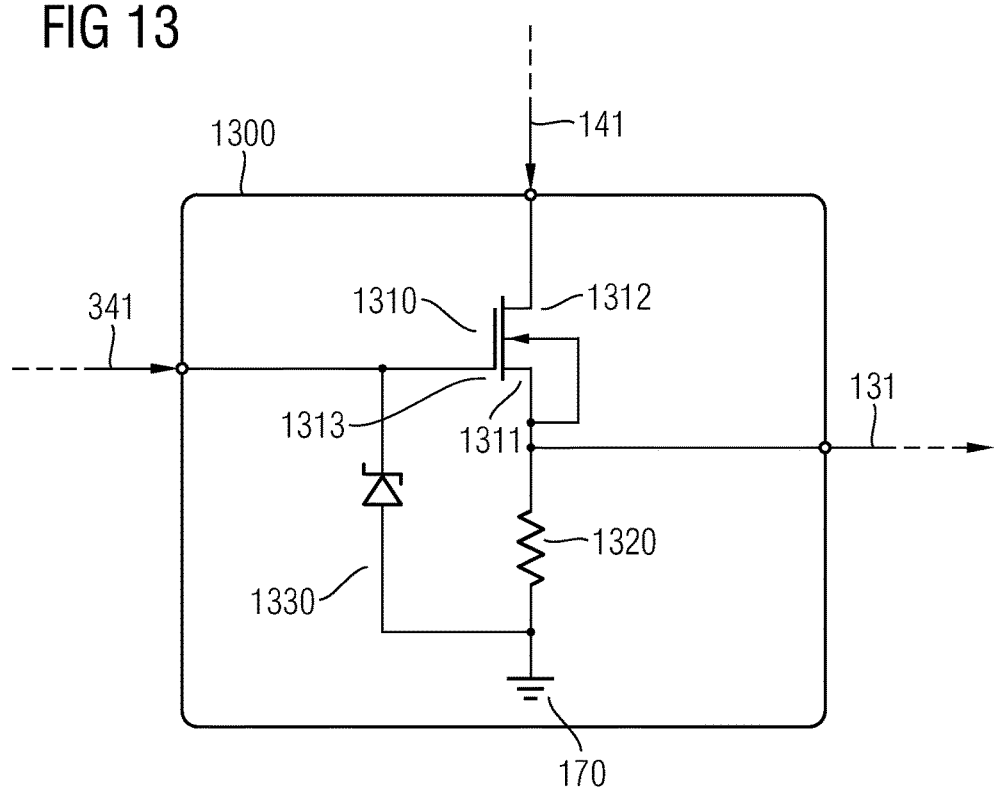
FIG. 13 shows a schematic circuit diagram of a regulation circuit according to various embodiments.

FIG. 13 shows a schematic circuit diagram of a regulation circuit 1300. In various embodiments the regulation circuit 350 of the apparatus 300 illustrated in FIG. 3 may be developed like the regulation circuit 1300.

The regulation circuit 1300 switches the DC voltage 141 provided by the DC voltage unit 140 synchronously to the control signal 341 to generate the auxiliary signal 131. This allows to adjust an amplitude of the auxiliary signal 131 by adjusting the DC voltage 141.

The regulation circuit 1300 comprises a field effect transistor 1310 arranged in a low drop out configuration. In some embodiments the DC voltage 141 is a positive voltage and the field effect transistor 1310 is an NMOS transistor. In other embodiments the DC voltage 141 is a negative voltage and the field effect transistor 1310 is a PMOS transistor.

The field effect transistor 1310 comprises a source 1311, a drain 1312 and a gate 1313. The source 1311 is connected to ground potential 170 via a resistor 1320. The drain 1312 is connected to the DC voltage 141. The gate 1313 is connected to the control signal 341.

The regulation circuit 1300 may comprise an overvoltage protection 1330 to protect the regulation circuit 1300 from overvoltages. The overvoltage protection 1330 may comprise a Zener diode which connects the gate 1313 of the field effect transistor 1310 to ground potential 170.

Figure 14:
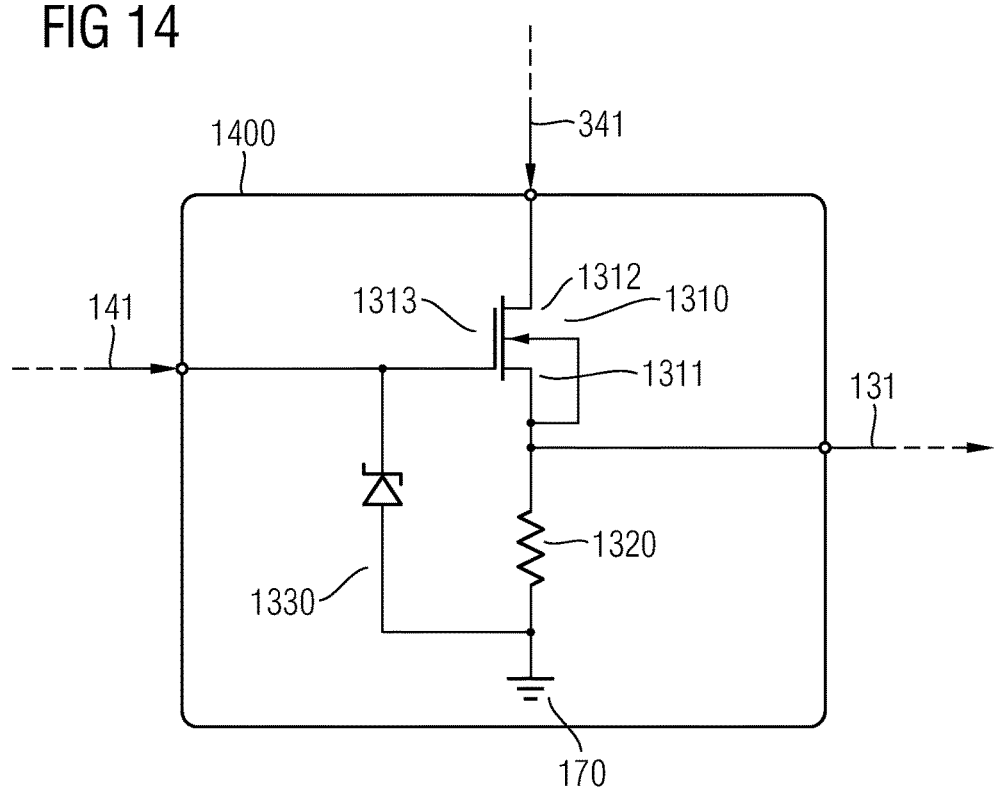
FIG. 14 shows a schematic circuit diagram of a further regulation circuit according to various embodiments.

FIG. 14 shows a schematic circuit diagram of a regulation circuit 1400. In various embodiments the regulation circuit 350 of the apparatus 300 illustrated in FIG. 3 may be developed like the regulation circuit 1400.

The regulation circuit 1400 differs from the regulation circuit 1300 illustrated in FIG. 13 in that the field effect transistor 1310 of the regulation circuit 1400 is arranged in a voltage follower configuration. The DC voltage 141 and the control signal 341 are interchanged in comparison to the regulation circuit 1300 of FIG. 13. The drain 1312 of the field effect transistor 1310 is connected to the control signal 341. The gate 1313 of the field effect transistor 1310 is connected to the DC voltage 141.

Figure 15:
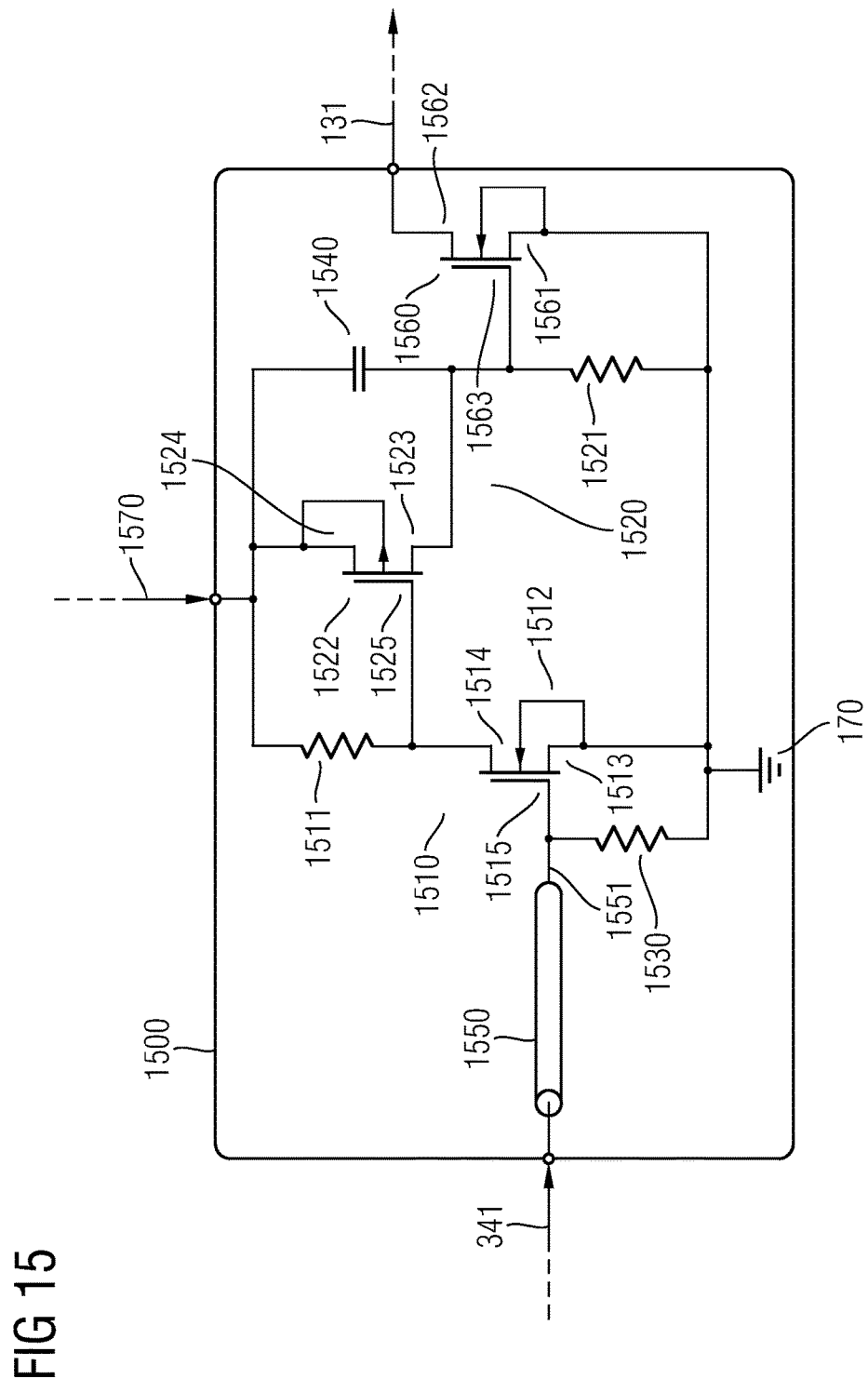
FIG. 15 shows a schematic circuit diagram of a shutdown circuit according to various embodiments.

FIG. 15 shows a schematic circuit diagram of a shutdown circuit 1500. In various embodiments the shutdown circuit 360 of the apparatus 300 illustrated in FIG. 3 may be developed like the shutdown circuit 1500.

The shutdown circuit 1500 is provided for pulling the auxiliary signal 131 to ground potential 170 after a decay of the control pulse of the control signal 341.

The shutdown circuit 1500 comprises a sixth delay line 1550 for delaying the control signal 341 by a sixth delay time in order to generate a shutdown signal 1551. The generated shutdown signal 1551 comprises a shutdown pulse which is delayed with respect to the control pulse of the control signal 341 by the sixth delay time. The sixth delay time is chosen such that the shutdown circuit 1500 pulls the auxiliary signal 131 to ground potential 170 after the test pulse 122 of the test signal 121 has been applied to the device 150. The sixth delay time may be chosen to be larger than the test pulse width 123 of the test pulse 122 of the test signal 121. The sixth delay line 1550 may, for example, comprise a coaxial cable.

The shutdown circuit 1500 comprises a first inverter 1510, a second inverter 1520 and a third transistor 1560. The first inverter 1510 and the second inverter 1520 are provided to invert the shutdown signal 1551 twice. The third transistor 1560 of the shutdown circuit 1500 is provided for pulling the auxiliary signal 131 to ground potential 170 in response to the shutdown pulse of the shutdown signal 1551.

The first inverter 1510 comprises a first transistor 1512 with a source 1513, a drain 1514 and a gate 1515. In various embodiments, the first transistor 1512 is an NMOS transistor. The source 1513 of the first transistor 1512 is connected to ground potential 170. The drain 1514 of the first transistor 1512 is connected to an external bias voltage 1570 via a first resistor 1511. The gate 1515 of the first transistor 1512 is connected to the shutdown signal 1551.

A third resistor 1530 is arranged between the gate 1515 and ground potential 170.

The second inverter 1520 comprises a second transistor 1522 which in various embodiments may be a PMOS transistor. The second transistor comprises a drain 1523, a source 1524 and a gate 1525. The drain 1523 of the second transistor 1522 is connected to ground potential 170 via a second resistor 1521. The source 1524 of the second transistor 1522 is connected to the external bias voltage 1570. The gate 1525 of the second transistor 1522 is connected to the drain 1514 of the first transistor 1512 of the first inverter 1510.

The third transistor 1560 may exemplarily be an NMOS transistor. The third transistor 1560 comprises a source 1561, a drain 1562 and a gate 1563. The source 1561 of the third transistor 1560 is connected to ground potential 170. The drain 1562 of the third transistor 1560 is connected to the auxiliary signal 131. The gate 1563 of the third transistor 1560 is connected to the drain 1523 of the second transistor 1522 of the second inverter 1520.

The shutdown circuit 1500 further comprises a capacitor 1540 arranged in parallel to the second transistor 1522 of the second inverter 1520 between the source 1524 and the gate 1563 of the third transistor 1560. The capacitor 1540 and the second resistor 1521 create a time constant which is large enough to ensure that the third transistor 1560 pulls the auxiliary signal 131 to ground potential 170 for a sufficiently long time.

The capacitor 1540 is charged after a rise of the shutdown pulse of the shutdown signal 1551. After a decay of the shutdown pulse of the shutdown signal 1551, the capacitor 1540 is discharged which prolongs the time that the third transistor 1560 pulls the auxiliary signal 131 to ground potential 170 beyond the decay of the shutdown pulse of the shutdown signal 1551.

In various embodiments of the apparatus 300 illustrated in FIG. 3 the signal sense circuit 320 of the apparatus 300 is developed like the signal sense circuit 400 illustrated in FIG. 4 and the signal processing circuit 340 of the apparatus 300 is developed like the signal processing circuit 800 illustrated in FIG. 8.

In various embodiments of the apparatus 300 illustrated in FIG. 3 the signal sense circuit 320 of the apparatus 300 is developed like the signal sense circuit 500 illustrated in FIG. 5 and the signal processing circuit 340 of the apparatus 300 is developed like the signal processing circuit 900 illustrated in FIG. 9.

In various embodiments of the apparatus 300 illustrated in FIG. 3 the signal sense circuit 320 of the apparatus 300 is developed like the signal sense circuit 500 illustrated in FIG. 5 and the signal processing circuit 340 of the apparatus 300 is developed like the signal processing circuit 1000 illustrated in FIG. 10.

In various embodiments of the apparatus 300 illustrated in FIG. 3 the signal sense circuit 320 of the apparatus 300 is developed like the signal sense circuit 600 illustrated in FIG. 6 and the signal processing circuit 340 of the apparatus 300 is developed like the signal processing circuit 900 illustrated in FIG. 9.

In some of these embodiments the apparatus 300 comprises the first power splitter 610 for splitting the source signal 111 into the first fractional signal 611 and the second fractional signal 612, the first delay line 310 for delaying the first fractional signal 611 to generate the test signal 121, the first resistor 410 for sensing the second fractional signal 612 to generate the first sense signal 321 comprising the first sense pulse indicative of a rise and a decay of the source pulse 112, the second delay line 620 for delaying the second fractional signal 612 to generate the delayed second fractional signal 613, the second resistor 510 for sensing the delayed second fractional signal 613 to generate the second sense signal 331 comprising the second sense pulse which rises after a rise of the first sense pulse and decays after a decay of the first sense pulse, the first amplification circuit 820 and the second amplification circuit 920 for amplifying the first sense signal 321 and the second sense signal 331, the OR gate 840 for generating the control signal 341 such that the control signal 341 assumes a logical high level when at least one of the first sense signal 321 and the second sense signal 331 assumes a logical high level, and the regulation circuit 350 for generating the auxiliary signal 131 such that the auxiliary pulse 132 rises and decays synchronously to the control pulse.

In some of these embodiments the regulation circuit 350 of the apparatus 300 is developed like the regulation circuit 1300 illustrated in FIG. 13.

In some embodiments the regulation circuit 350 of the apparatus 300 is developed like the regulation circuit 1400 illustrated in FIG. 14.

In various embodiments of the apparatus 300 illustrated in FIG. 3 the signal sense circuit 320 of the apparatus 300 is developed like the signal sense circuit 600 illustrated in FIG. 6 and the signal processing circuit 340 of the apparatus 300 is developed like the signal processing circuit 1000 illustrated in FIG. 10.

In some embodiments of the apparatus 300 illustrated in FIG. 3, the signal sense circuit 320 of the apparatus 300 is developed like the signal sense circuit 700 illustrated in FIG. 7 and the signal processing circuit 340 of the apparatus 300 is developed like the signal processing circuit 1100 illustrated in FIG. 11.

Figure 16:
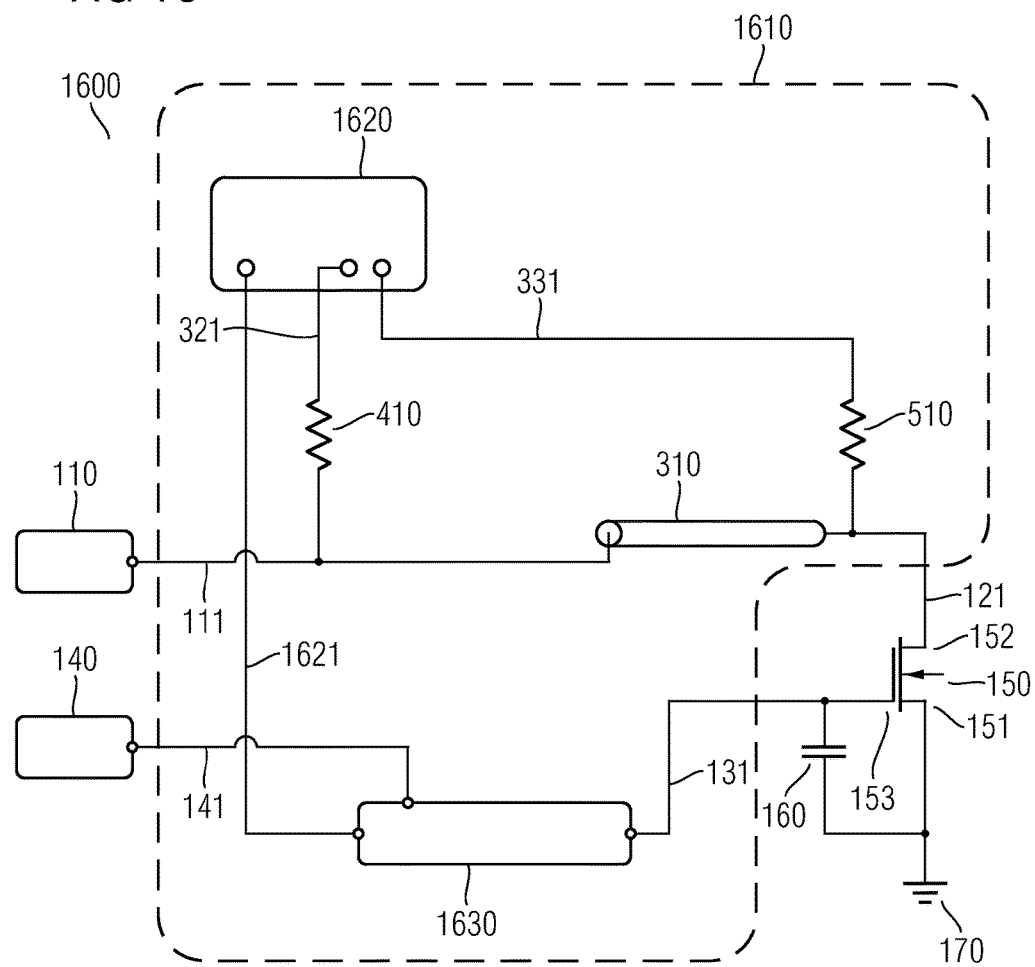
FIG. 16 shows a schematic circuit diagram of a further system for performing an ESD stress test according to various embodiments.

FIG. 16 shows a schematic circuit diagram of a system 1600 according to various embodiments. The system 1600 is configured for performing an ESD stress test of an electronic device.

The system 1600 illustrated in FIG. 16 differs from the system 100 illustrated in FIG. 1 in that the apparatus 300 of the system 100 is replaced by an apparatus 1610.

The apparatus 1610 comprises an oscilloscope 1620 and a dynamic gate control unit 1630. In various embodiments the oscilloscope 1620 and the dynamic gate control unit 1630 may be controlled by a computer.

The apparatus 1610 comprises means for generating a first sense signal 321 comprising a first sense pulse indicative of a rise and a decay of the source pulse 112 of the source signal 111. The means for generating the first sense signal 321 may include a first resistor 410 connected to the source signal 111, as illustrated in FIG. 16. The first sense signal 321 is fed to the oscilloscope 1620.

The system 1600 further comprises means for delaying the source pulse 112 of the source signal 111 to generate the test signal 121 comprising the test pulse 122. The means for delaying the source pulse 112 may include a first delay line 310, as illustrated in FIG. 16.

The system 1600 further comprises means for generating a second sense signal 331 comprising a second sense pulse which rises after a rise of the first sense pulse of the first sense signal 321 and which decays after a decay of the first sense pulse of the first sense signal 321. The means for generating the second sense signal 331 may include a second resistor 510 connected to the test signal 121, as illustrated in FIG. 16. The second sense signal 331 is fed to the oscilloscope 1620.

The oscilloscope 1620 is configured to create a trigger signal 1621 which is fed to the dynamic gate control unit 1630. In some embodiments the trigger signal 1621 may be a signal in TTL logic. According to some embodiments the trigger signal 1621 may comprise a trigger pulse which rises before a rise of the test pulse 122 of the test signal 121 and which decays after a decay of the test pulse 122 of the test signal 121. The trigger pulse may rise in response to a rise of the first sense pulse of the first sense signal 321 and may decay in response to a decay of the second sense pulse of the second sense signal 331.

The dynamic gate control unit 1630 switches the DC voltage 141 provided by the DC voltage unit 140 to create the auxiliary signal 131 comprising the auxiliary pulse 132 which rises before a rise of the test pulse 122 of the test signal 121 and which decays after a decay of the test pulse 122 of the test signal 121. The auxiliary pulse 132 of the auxiliary signal 131 may, for example, be generated synchronously to the trigger pulse of the trigger signal 1621.

In the exemplary embodiments explained above the first sense signal 321 and the second sense signal 331 are generated by sensing voltages of the source signal 111 and the test signal 121. In other embodiments the first sense signal 321 and the second sense signal 331 are generated by sensing currents of the source signal 111 and the test signal 121.

The system 100 illustrated in FIG. 1 and the system 1600 illustrated in FIG. 16 may comprise further components. The systems 100, 1600 may, for example, comprise a DC spot unit to perform basic functionality tests of the device 150 after an ESD stress test. The DC spot unit may, for example, provide a DC spot voltage which can be applied to the drain 152 of the device 150. In this case the systems 100, 1600 may comprise a switch to apply either the DC spot voltage provided by the DC spot unit or the test signal 121 provided by the apparatuses 300, 1610 to the drain 152 of the device 150.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electrostatic discharge (ESD) stress testing apparatus, the apparatus comprising:
a signal sense circuit configured to receive a source signal comprising a source pulse;
a first delay line coupled to the signal sense circuit and a first input of a device under test (DUT), the first delay line being configured to delay the source pulse to generate a test signal at the first input, wherein the test signal comprises a test pulse with a pulse width in an time range from 1 ns to 1 µs; and
a regulation circuit coupled to the signal sense circuit and a second input of the DUT, the regulation circuit being configured to generate an auxiliary signal at the second input, wherein the auxiliary signal comprises an auxiliary pulse with a pulse width in the time range.

2. The apparatus according to claim 1, wherein the auxiliary pulse is generated such that the auxiliary pulse rises before a rise of the test pulse and decays after a decay of the test pulse.

3. The apparatus according to claim 1, wherein the auxiliary pulse is generated such that the auxiliary pulse rises before a rise of the test pulse and decays before a decay of the test pulse.

4. The apparatus according to claim 1, wherein the auxiliary pulse is generated such that the auxiliary pulse rises after a rise of the test pulse and decays after a decay of the test pulse.

5. The apparatus according to claim 1, wherein the test pulse is generated with a rise time and a pulse width which respectively deviate from a rise time and a pulse width of the source pulse by not more than 10%.

6. The apparatus according to claim 1, wherein the regulation circuit is further configured to generate the auxiliary pulse with an amplitude which is independent of an amplitude of the source pulse.

7. The apparatus according to claim 1, wherein the signal sense circuit is further configured to generate a first sense signal comprising a first sense pulse indicative of a rise and a decay of the source pulse.

8. The apparatus according to claim 1, wherein the signal sense circuit comprises a resistor.

9. The apparatus according to claim 7, wherein the signal sense circuit comprises a first power splitter configured to split the source signal into a first fractional signal for generating the test signal and a second fractional signal for generating the first sense signal.

10. The apparatus according to claim 1, wherein the apparatus further comprises:
a signal processing circuit configured to generate a control signal comprising a control pulse, wherein the signal processing circuit comprises an amplification circuit configured to generate the control pulse with an amplitude that is different from an amplitude of a first sense pulse.

11. The apparatus according to claim 1, wherein
the signal sense circuit is further configured to generate a second sense signal comprising a second sense pulse which rises after a rise of a first sense pulse of a first sense signal and decays after a decay of the first sense pulse; and
the apparatus further comprises a signal processing circuit coupled to the signal sense circuit and the regulation circuit, the signal processing circuit comprising an OR gate configured to generate a control signal such that the control signal assumes a logical high level when at least one of the first sense signal and the second sense signal assumes a logical high level.

12. The apparatus according to claim 1, wherein the apparatus further comprises a signal processing circuit coupled to the signal sense circuit and the regulation circuit, the signal processing circuit comprising
a first power splitter configured to split a first sense signal into a first fractional sense signal and a second fractional sense signal,
a second delay line configured to delay the first fractional sense signal and a third delay line configured to delay the second fractional sense signal, and
a second power splitter configured to combine the delayed first fractional sense signal and the delayed second fractional sense signal to form a control signal.

13. The apparatus according to claim 1, wherein
the signal sense circuit is further configured to generate a second sense signal comprising a second sense pulse which rises after a rise of a first sense pulse of a first sense signal and decays after a decay of the first sense pulse, and
the apparatus further comprises a signal processing circuit coupled to the signal sense circuit and the regulation circuit, the signal processing circuit comprising a comparator configured to compare a control signal such that the control signal assumes a logical high level when at least one of the first sense signal and the second sense signal exceeds a reference voltage.

14. The apparatus according to claim 1, wherein
the apparatus further comprises a signal processing circuit configured to generate a control signal comprising a control pulse, and
the regulation circuit is further configured to generate the auxiliary signal such that the auxiliary pulse rises and decays synchronously to the control pulse.

15. The apparatus according to claim 1, wherein the apparatus further comprises:
a signal processing circuit configured to generate a control signal comprising a control pulse; and
a shutdown circuit configured to pull the auxiliary signal to ground after a decay of the control pulse.

16. The apparatus according to claim 15, wherein the shutdown circuit comprises
a sixth delay configured to generate a shutdown pulse which is delayed with respect to the control pulse,
a transistor configured to pull the auxiliary signal to ground responsive to the shutdown pulse, and
a circuit configured to pull the auxiliary signal to ground for an amount of time which is longer than a width of the shutdown pulse, the circuit comprising a resistor and a capacitor.

17. The apparatus according to claim 1, wherein:
the first delay line is further configured to delay a first fractional signal to generate the test signal;
the signal sense circuit comprises
a power splitter configured to split the source signal into the first fractional signal and a second fractional signal,
a first resistor configured to sense the second fractional signal and to generate a first sense signal comprising a first sense pulse indicative of a rise and a decay of the source pulse,
a second delay line configured to delay the second fractional signal and to generate a delayed second fractional signal, and
a second resistor configured to sense the delayed second fractional signal and to generate a second sense signal comprising a second sense pulse which rises after a rise of the first sense pulse and decays after a decay of the first sense pulse;

the apparatus further comprises a signal processing circuit coupled to the signal sense circuit and the regulation circuit, the signal processing circuit comprising an amplification circuit configured to amplify the first sense signal and the second sense signal, and an OR gate configured to generate a control signal such that the control signal assumes a logical high level when at least one of the first sense signal and the second sense signal assumes a logical high level; and the regulation circuit is further configured to generate the auxiliary signal such that the auxiliary pulse rises and decays synchronously to a control pulse.

18. An electrostatic discharge (ESD) stress testing method for generating signals for an electronic device, the method comprising:

receiving a source signal comprising a source pulse;

delaying the source pulse to generate a test signal comprising a test pulse with a pulse width in an ESD time range from 1 ns to 1 µs;

propagating the test signal to a first input of the electronic device;

generating an auxiliary signal comprising an auxiliary pulse with a pulse width in the ESD time range; and propagating the auxiliary signal to a second input of the electronic device.

19. An electrostatic discharge (ESD) stress testing system, the system comprising:

means for generating a source signal comprising a source pulse;

means for delaying the source pulse to generate a test signal comprising a test pulse with a pulse width in an ESD time range from 1 ns to 1 µs, the means for delaying the source pulse being coupled to the means for generating a source signal, wherein the test pulse is received at a first input of a device under test (DUT); and means for generating an auxiliary signal comprising an auxiliary pulse with a pulse width in the ESD time range, the means for generating the auxiliary signal being coupled to the means for delaying the source pulse, wherein the auxiliary pulse is received at a second input of the DUT.

20. The apparatus according to claim 1, wherein the signal sense circuit is further configured to generate a second sense signal comprising a second sense pulse which rises after a rise of a first sense pulse of a first sense signal and decays after a decay of the first sense pulse, and the apparatus further comprises a signal processing circuit configured to generate a control signal comprising a control pulse.

\* \* \* \* \*